(12) United States Patent
Yonebayashi

(10) Patent No.: US 12,154,506 B2
(45) Date of Patent: Nov. 26, 2024

(54) DISPLAY DEVICE AND PIXEL CIRCUIT

(71) Applicant: Sharp Kabushiki Kaisha, Sakai (JP)

(72) Inventor: Ryo Yonebayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 18/039,982

(22) PCT Filed: Dec. 4, 2020

(86) PCT No.: PCT/JP2020/045197
§ 371 (c)(1),
(2) Date: Jun. 2, 2023

(87) PCT Pub. No.: WO2022/118458
PCT Pub. Date: Jun. 9, 2022

(65) Prior Publication Data
US 2024/0021161 A1    Jan. 18, 2024

(51) Int. Cl.
*G09G 3/3241* (2016.01)
*G09G 3/3266* (2016.01)

(52) U.S. Cl.
CPC ......... *G09G 3/3241* (2013.01); *G09G 3/3266* (2013.01); *G09G 2300/0852* (2013.01); *G09G 2310/0262* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2013/0063498 A1* | 3/2013 | Yabukane | G09G 3/3225 345/77 |
| 2013/0093737 A1 | 4/2013 | Ota et al. | |
| 2015/0070407 A1* | 3/2015 | Lee | G09G 3/3233 345/76 |
| 2015/0170569 A1* | 6/2015 | Han | G09G 3/3258 345/78 |
| 2016/0189597 A1* | 6/2016 | Park | G09G 3/3225 345/694 |
| 2017/0047016 A1* | 2/2017 | Son | G09G 3/20 |
| 2020/0312239 A1* | 10/2020 | Ooyama | G09G 3/3225 |
| 2022/0189416 A1* | 6/2022 | Jung | G09G 3/3233 |

FOREIGN PATENT DOCUMENTS

JP    2013-088611 A    5/2013

* cited by examiner

*Primary Examiner* — Nitin Patel
*Assistant Examiner* — Amen W Bogale
(74) *Attorney, Agent, or Firm* — Keating & Bennett, LLP

(57) ABSTRACT

A pixel circuit of a display device includes: a light-emitting element; a drive transistor; a write control transistor having one conductive terminal connected to a data line and a control terminal connected to a scanning line; a first capacitor provided between a control terminal of the drive transistor and a conductive terminal of the drive transistor on the light-emitting element side; a second capacitor provided between another conductive terminal of the write control transistor and the control terminal of the drive transistor; and a mode selection circuit provided in parallel to the second capacitor and configured to cause a short-circuit and an open-circuit between electrodes of the second capacitor in accordance with a voltage of a mode selection line. Accordingly, a display device capable of easily performing gradation control is provided.

19 Claims, 13 Drawing Sheets

DISPLAY DEVICE AND PIXEL CIRCUIT

TECHNICAL FIELD

The disclosure relates to a display device, and more particularly to a display device provided with a pixel circuit including a current-driven light-emitting element.

BACKGROUND ART

In recent years, an organic electroluminescent (hereinafter referred to as EL) display device provided with a pixel circuit including an organic EL element has been put to practical use. The pixel circuit of the organic EL display device includes, in addition to the organic EL element, a drive transistor, a write control transistor, and the like. For each of these transistors, a thin-film transistor (hereinafter referred to as TFT) is used. The organic EL element is a current-driven light-emitting element that emits light with luminance corresponding to the amount of a flowing current. The drive transistor is provided in series with the organic EL element and controls the amount of current flowing through the organic EL element.

FIG. 20 is a circuit diagram of a pixel circuit of a known display device. In a pixel circuit 9 illustrated in FIG. 20, a TFT Q4 functions as a drive transistor, and a TFT Q1 functions as a write control transistor. During the write period for the pixel circuit 9, the TFTs Q1, Q3 are turned on, and the TFT Q2 is turned off. At this time, the gate voltage of TFT Q4 becomes equal to the voltage of the data line Sj (hereinafter referred to as a data voltage Vdata). At the end of the write period, the TFTs Q1, Q3 are turned off, and the TFT Q2 is turned on. Thereafter, a drive current Ioled corresponding to the data voltage Vdata (the gate voltage of the TFT Q4) flows through a current path passing through the TFT Q4, the TFT Q2, and an organic EL element L9. The organic EL element L9 emits light with luminance corresponding to the drive current Ioled.

In relation to the disclosure, Patent Document 1 describes an electro-optical device that accurately controls a drive current flowing through a light-emitting element by applying a voltage divided using a capacitor provided outside a pixel circuit to a gate terminal of a drive transistor.

CITATION LIST

Patent Document

Patent Document 1: Japanese Laid-Open Patent Publication No. 2013-88611

SUMMARY

Technical Problem

FIG. 21 is a diagram illustrating a relationship between the data voltage Vdata and the drive current Ioled in the pixel circuit 9. The data voltage Vdata is controlled to a low voltage when a low-level gradation is displayed, and is controlled to a high voltage when a high-level gradation is displayed. Consider a case where the data voltage Vdata is controlled in the vicinity of the broken line portion illustrated in FIG. 21 in order to display a low-level gradation. In the vicinity of the broken line portion, the amount of change in the drive current Ioled with respect to the amount of change in the data voltage Vdata is large. Thus, when the data voltage Vdata changes slightly in the vicinity of the broken line portion, the luminance of the organic EL element L9 changes significantly. Hence the known display device including the pixel circuit 9 has a problem in that it is difficult to perform gradation control at the time of displaying a low-level gradation.

Therefore, it is an object to provide a display device that can easily perform gradation control.

Means for Solving the Problems

The above problem can be solved by, for example, a display device including: a display panel that includes a plurality of scanning lines, a plurality of data lines, a plurality of mode selection lines, and a plurality of pixel circuits; a scanning line drive circuit configured to drive the scanning lines; and a data line drive circuit configured to drive the data lines. Each of the pixel circuits includes a light-emitting element, a drive transistor configured to control an amount of current flowing through the light-emitting element, a write control transistor having one conductive terminal connected to the one of the data lines and a control terminal connected to the one of the scanning lines, a first capacitor provided between a control terminal of the drive transistor and a conductive terminal of the drive transistor, a second capacitor provided between another conductive terminal of the write control transistor and the control terminal of the drive transistor, and a mode selection circuit provided in parallel with the second capacitor and configured to cause a short-circuit and an open-circuit between electrodes of the second capacitor in accordance with a voltage of one of the mode selection lines.

The above problem can also be solved by a pixel circuit included in the above display device.

Effects of the Disclosure

According to the display device and the pixel circuit described above, a short-circuit and an open-circuit are caused between the electrodes of the second capacitor using the mode selection circuit, whereby the number of charges accumulated in the first capacitor can be changed to change the amount of the drive current flowing through the light-emitting element. Therefore, by causing an open-circuit between the electrodes of the second capacitor in accordance with the operation state to be set to reduce the amount of drive current, the amount of change in the drive current with respect to the amount of change in the voltage of the one of the data lines can be reduced to facilitate gradation control.

DESCRIPTION OF EMBODIMENTS

Hereinafter, a display device according to each embodiment will be described with reference to the drawings. The display device according to each embodiment is an organic EL display device provided with a plurality of pixel circuits each including an organic EL element. In the following description, a voltage at which the transistor is turned on when applied to the control terminal of the transistor is referred to as an on-voltage, and a voltage at which the transistor is turned off is referred to as an off-voltage. For example, for an N-channel transistor, a high-level voltage is an on-voltage, and a low-level voltage is an off-voltage. Hereinafter, m and n are integers of 2 or more, i is an integer of 1 or more and m or less, and j is an integer of 1 or more and n or less.

First Embodiment

Figure 1:
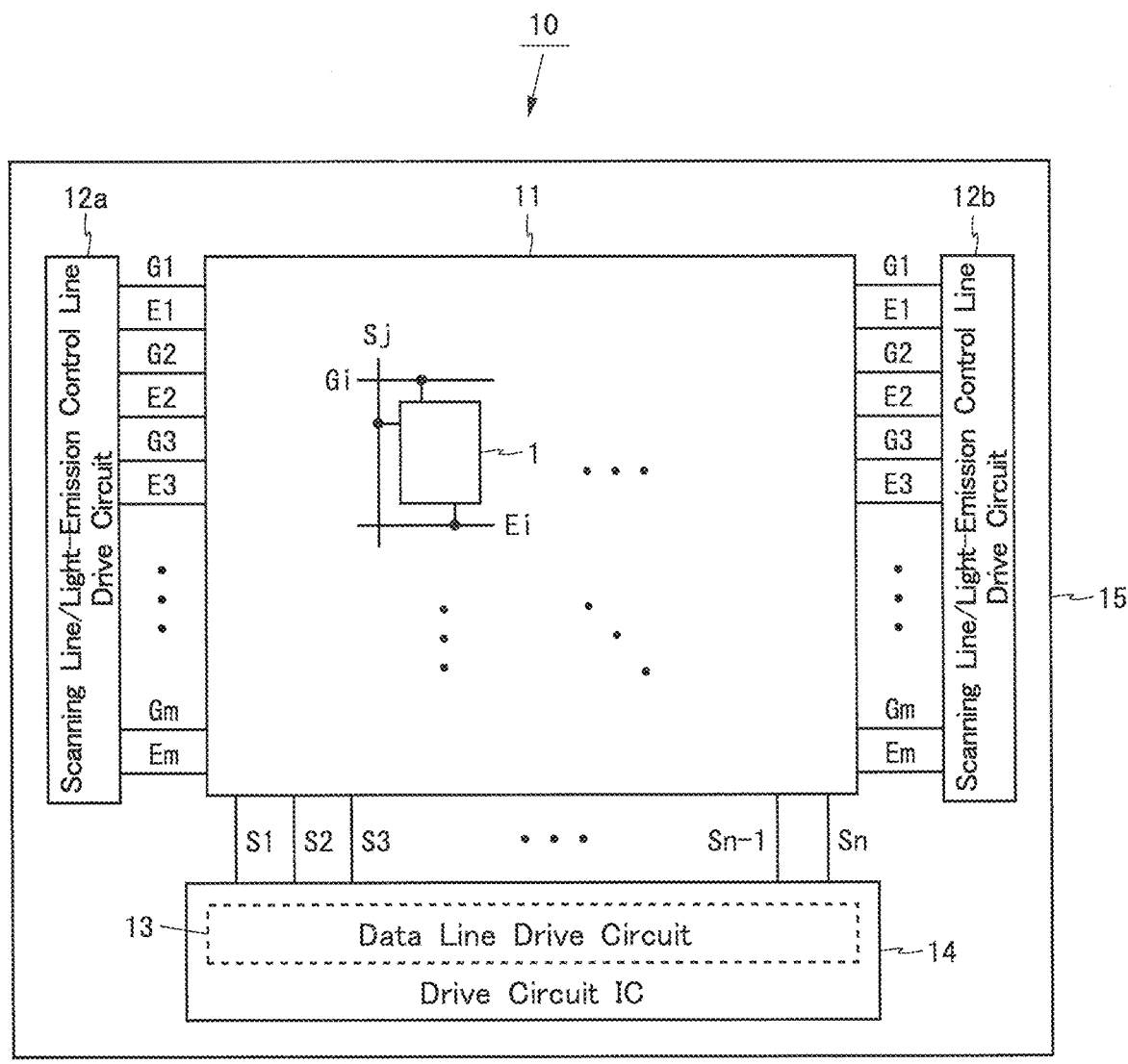
FIG. 1 is a block diagram illustrating a configuration of a display device according to a first embodiment.

FIG. 1 is a block diagram illustrating a configuration of a display device according to a first embodiment. A display device 10 illustrated in FIG. 1 includes a display portion 11, scanning line/light-emission control line drive circuits 12a, 12b, and a data line drive circuit 13. The display device 10 has a function of setting the display portion 11 to either a high luminance mode or a low luminance mode.

The display portion 11 is formed in a rectangular shape on an organic EL panel 15. The display portion 11 is also referred to as an active area. The scanning line/light-emission control line drive circuits 12a, 12b include a scanning line drive circuit and a light-emission control line drive circuit and are formed integrally with the display portion 11 on the organic EL panel 15 (gate diver monolithic configuration). A data line drive circuit 13 is incorporated in a drive circuit IC 14. The drive circuit IC 14 is mounted on the organic EL panel 15.

The display portion 11 includes m scanning lines G1 to Gm, n data lines S1 to Sn, m light-emission control lines E1 to Em, m mode selection lines (not illustrated), and (m×n) pixel circuits 1. The scanning lines G1 to Gm are arranged in parallel to each other. The data lines S1 to Sn are arranged to be orthogonal to the scanning lines G1 to Gm. The light-emission control lines E1 to Em are arranged in parallel to the scanning lines G1 to Gm. The scanning lines G1 to Gm and the data lines S1 to Sn intersect at (m×n) locations. The (m×n) pixel circuits 1 are arranged corresponding to the intersections of the scanning lines G1 to Gm and the data lines S1 to Sn. A power supply voltage and an initialization voltage are supplied to the display portion 11 using wiring or electrodes (not illustrated).

The scanning line/light-emission control line drive circuit 12a is disposed along one side (the left side in FIG. 1) of the display portion 11 and is connected to one end (the left end in FIG. 1) of each of the scanning lines G1 to Gm and the light-emission control lines E1 to Em. The scanning line/light-emission control line drive circuit 12a drives the scanning lines G1 to Gm and the light-emission control lines E1 to Em from one end side. The scanning line/light-emission control line drive circuit 12b is disposed along the opposite side (the right side in FIG. 1) of the display portion 11 and is connected to another end (the right end in FIG. 1) of each of the scanning lines G1 to Gm and the light-emission control lines E1 to Em. The scanning line/light-emission control line drive circuit 12b drives the scanning lines G1 to Gm and the light-emission control lines E1 to Em from another end side. The scanning line/light-emission control line drive circuits 12a, 12b sequentially select the scanning lines G1 to Gm in ascending order each for one horizontal period. The drive circuit IC 14 is disposed along another side (the lower side in FIG. 1) of the display portion 11 and is connected to one end (the lower end in FIG. 1) of each of the data lines S1 to Sn. The data line drive circuit 13 incorporated in the drive circuit IC 14 drives the data lines S1 to Sn.

In FIG. 1, two scanning line/light-emission control line drive circuits are provided on both sides of the display portion 11, and the scanning lines G1 to Gm and the light-emission control lines E1 to Em are driven from both sides. Alternatively, one scanning line/light-emission control line drive circuit may be provided on one side of the display portion 11, and the scanning lines G1 to Gm and the light-emission control lines E1 to Em may be driven from one side. The scanning line drive circuit and the light-emission control line drive circuit may be formed of different circuits.

Figure 2:
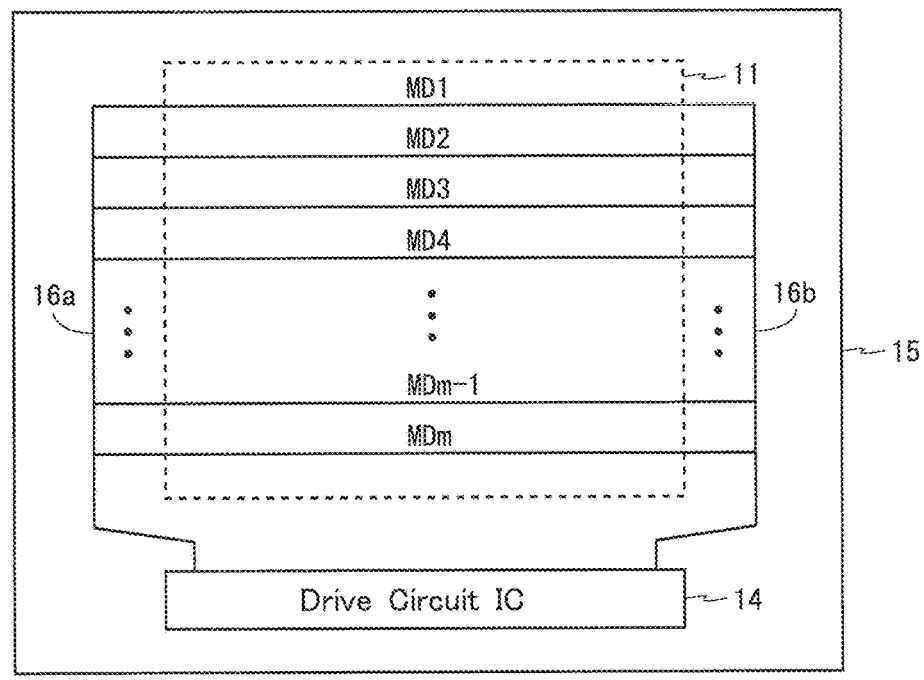
FIG. 2 is a diagram illustrating a layout of mode selection lines of the display device illustrated in FIG. 1.

FIG. 2 is a diagram illustrating a layout of mode selection lines. As illustrated in FIG. 2, the display portion 11 includes m mode selection lines MD1 to MDm. The mode selection lines MD1 to MDm are arranged in parallel to the scanning lines G1 to Gm. The mode selection line MDi is disposed corresponding to the scanning line Gi. Both ends of the mode selection lines MD1 to MDm are connected to the drive circuit IC 14 via wirings 16a, 16b provided in the periphery of the display portion 11. The drive circuit IC 14 applies the same voltage (either the high-level voltage or the low-level voltage) to the mode selection lines MD1 to MDm in accordance with an operation state to be set.

Figure 3:
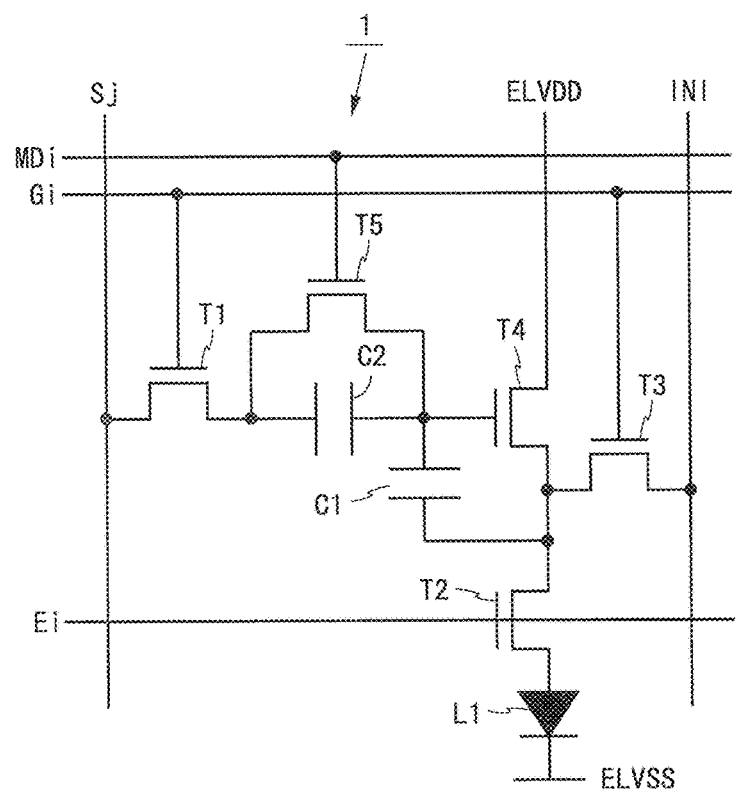
FIG. 3 is a circuit diagram of a pixel circuit of the display device illustrated in FIG. 1.

FIG. 3 is a circuit diagram of the pixel circuit 1. FIG. 3 illustrates a pixel circuit 1 in an ith row and a jth column. The pixel circuit 1 includes five TFTs T1 to T5, two capacitors C1, C2, and an organic EL element L1. Each of the TFTs T1 to T5 is an N-channel transistor. The pixel circuit 1 is supplied with a high-level power supply voltage ELVDD and a low-level power supply voltage ELVSS. The pixel circuit 1 is connected to the scanning line Gi, the data line Sj, the light-emission control line Ei, the mode selection line MDi, and an initialization line INI to which an initialization voltage is applied.

The high-level power supply voltage ELVDD is applied to the drain terminal of the TFT T4. The source terminal of the TFT T4 is connected to the drain terminal of the TFT T2. The source terminal of the TFT T2 is connected to the anode terminal of the organic EL element L1. The low-level power supply voltage ELVSS is applied to the cathode terminal of the organic EL element L1. One conductive terminal (the left terminal in FIG. 3) of the TFT T1 is connected to the data line Sj. The capacitor C1 is provided between the gate terminal and the source terminal (the conductive terminal on the organic EL element L1 side) of the TFT T4. The capacitor C2 is provided between another conductive terminal of the TFT T1 and the gate terminal of the TFT T4.

One conductive terminal (the right terminal in FIG. 3) of the TFT T3 is connected to the initialization line INI. Another conductive terminal of the TFT T3 is connected to the source terminal of the TFT T4, the drain terminal of the TFT T2, and one electrode (the lower electrode in FIG. 2) of the capacitor C1. One conductive terminal (the left terminal in FIG. 3) of the TFT T5 is connected to the another conductive terminal of the TFT T1 and one electrode (the left electrode in FIG. 2) of the capacitor C2. Another conductive terminal of the TFT T5 is connected to the gate terminal of the TFT T4, another electrode of the capacitor C1, and another electrode of the capacitor C2. The gate terminals of the TFTs T1, T3 are connected to the scanning line Gi. The gate terminal of the TFT T2 is connected to the light-emission control line Ei. The gate terminal of the TFT T5 is connected to the mode selection line MDi.

In the pixel circuit 1, the organic EL element L1 functions as a light-emitting element. The TFT T4 functions as a drive transistor that controls the amount of current flowing through the light-emitting element. The TFT T1 functions as a write control transistor having one conductive terminal connected to the data line Sj and a control terminal connected to the scanning line Gi. The capacitor C1 functions as a first capacitor provided between the control terminal of the drive transistor and the conductive terminal of the drive transistor on the light-emitting element side. The capacitor C2 functions as a second capacitor provided between another conductive terminal of the write control transistor and the control terminal of the drive transistor. The TFT T2 is provided on a current path passing through the drive transistor and the light-emitting element and functions as a light-emission control transistor having a control terminal connected to the light-emission control line Ei. The TFT T5 functions as a selection transistor having one conductive terminal connected to the another conductive terminal of the write control transistor, another conductive terminal connected to the control terminal of the drive transistor, and the control terminal (gate terminal) connected to the mode selection line MDi. The selection transistor is provided in parallel with the second capacitor and constitutes a mode selection circuit that causes a short-circuit and an open-circuit between the electrodes of the second capacitor in accordance with the voltage of the mode selection line MDi.

Figure 4:
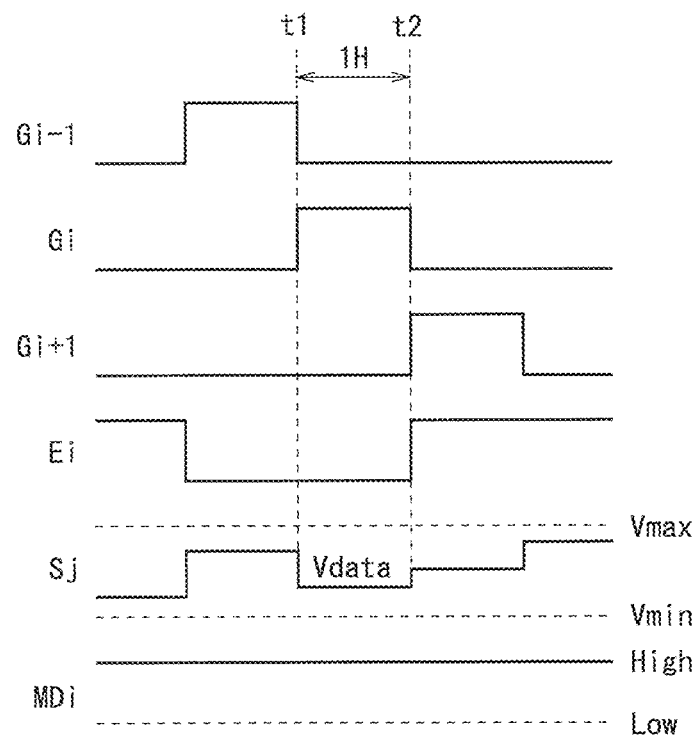
FIG. 4 is a timing chart of a high luminance mode of the display device illustrated in FIG. 1.
Figure 5:
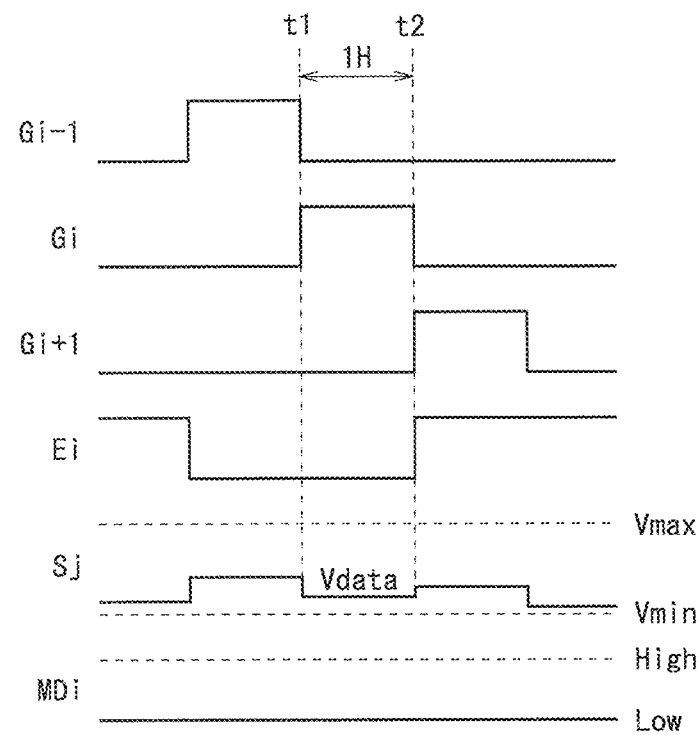
FIG. 5 is a timing chart of a low luminance mode of the display device illustrated in FIG. 1.

FIG. 4 is a timing chart of the high luminance mode of the display device 10. FIG. 5 is a timing chart of the low luminance mode of the display device 10. FIGS. 4 and 5 illustrate the timing of writing the voltage to the pixel circuit 1 in the ith row and the jth column. In the high luminance mode, the voltage of the mode selection line MDi is fixedly controlled to the high level (FIG. 4). At this time, the TFT T5 comes into an on-state fixedly. In the low luminance mode, the voltage of the mode selection line MDi is fixedly controlled to the low level (FIG. 5). At this time, the TFT T5 comes into an off-state fixedly.

As illustrated in FIGS. 4 and 5, the voltages of the scanning lines Gi−1, Gi, Gi+1 are sequentially controlled to the high level each for one horizontal period (denoted as 1H in the drawings). A period from time t1 to time t2 is a write period (hereinafter referred to as a selection period Pi) for the pixel circuits 1 in the ith row. During the selection period Pi, the voltage of the scanning line Gi is controlled to the high level, the voltage of the data line Sj is controlled to the data voltage Vdata, and the voltage of the light-emission control line Ei is controlled to the low level. Thus, the TFTs T1, T3 are turned on, and the TFT T2 is turned off. At this time, no drive current flows through the organic EL element L1, and hence the organic EL element L1 does not emit light.

When the TFT T3 is turned on at time t1, the voltages at the source terminal of the TFT T4 and the drain terminal of the TFT T2 become equal to the initialization voltage applied to the initialization line INI. When the TFT T1 is turned on at time t1, the voltage Vdata of the data line Sj is written into the pixel circuit 1 via the TFT T1. The capacitor C1 accumulates charges corresponding to the data voltage Vdata. The capacitor C2 does not accumulate charges when the TFT T5 is in the on-state (in the high luminance mode), and accumulates charges corresponding to the data voltage Vdata when the TFT T5 is in the off-state (in the low luminance mode).

At time t2, the voltage of the scanning line Gi changes to the low level, and the voltage of the light-emission control line Ei changes to the high level. Thus, the TFTs T1, T3 are turned off, and the TFT T2 is turned on. After time t2, the drive current Ioled corresponding to the gate-source voltage of the TFT T4 flows through a current path passing through the TFT T4, the TFT T2, and the organic EL element L1, and the organic EL element L1 emits light with luminance corresponding to the drive current Ioled.

Figure 6:
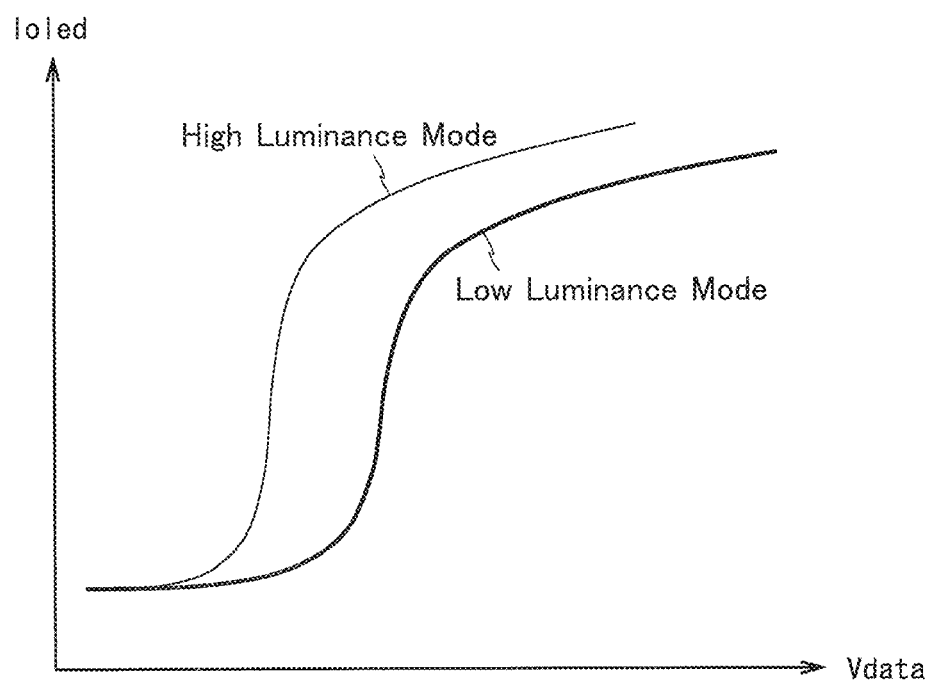
FIG. 6 is a diagram illustrating a relationship between a data voltage and a drive current in the pixel circuit illustrated in FIG. 3.

FIG. 6 is a diagram illustrating a relationship between the data voltage Vdata and the drive current Ioled in the pixel circuit 1. In the high luminance mode, the TFT T5 is fixedly in the on-state. Therefore, in the selection period Pi, the capacitor C1 accumulates charges corresponding to the data voltage Vdata, and the capacitor C2 does not accumulate charges. At this time, the gate voltage of the TFT T4 is equal to the data voltage Vdata. Therefore, in the high luminance mode, the drive current Ioled changes as indicated by the thin line in FIG. 6 in accordance with the data voltage Vdata.

In the low luminance mode, the TFT T5 is fixedly in the off-state. Therefore, in the selection period Pi, each of the capacitors C1, C2 accumulates charges corresponding to the data voltage Vdata and the ratio between the capacitance values of the capacitors C1, C2. At this time, the gate voltage of the TFT 14 is a voltage obtained by proportionally dividing the data voltage Vdata by the capacitance values of the capacitors C1, C2, and is lower than the data voltage Vdata. Thus, in the low luminance mode, the drive current Ioled changes as indicated by the thick line in FIG. 6 in accordance with the data voltage Vdata.

Figure 21:
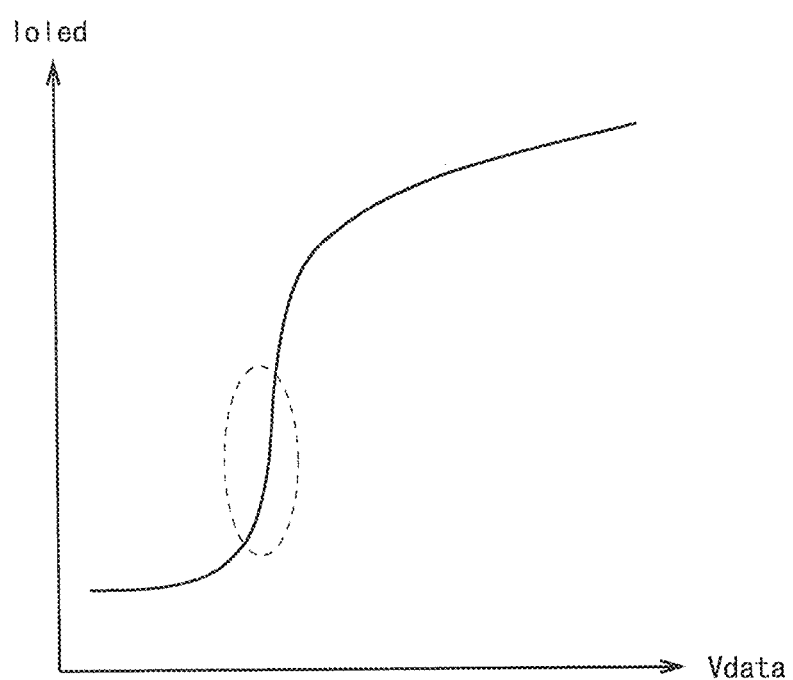
FIG. 21 is a diagram illustrating a relationship between a data voltage and a drive current in the pixel circuit illustrated in FIG. 20.

The curve in the high luminance mode illustrated in FIG. 6 is the same as the curve illustrated in FIG. 21. The curve in the low luminance mode illustrated in FIG. 6 has the shape of the curve in the high luminance mode extended in the horizontal axis direction. Therefore, when a low-level gradation is displayed, the amount of change in the drive current Ioled with respect to the amount of change in the data voltage Vdata is smaller in the low luminance mode than in the high luminance mode.

Figure 20:
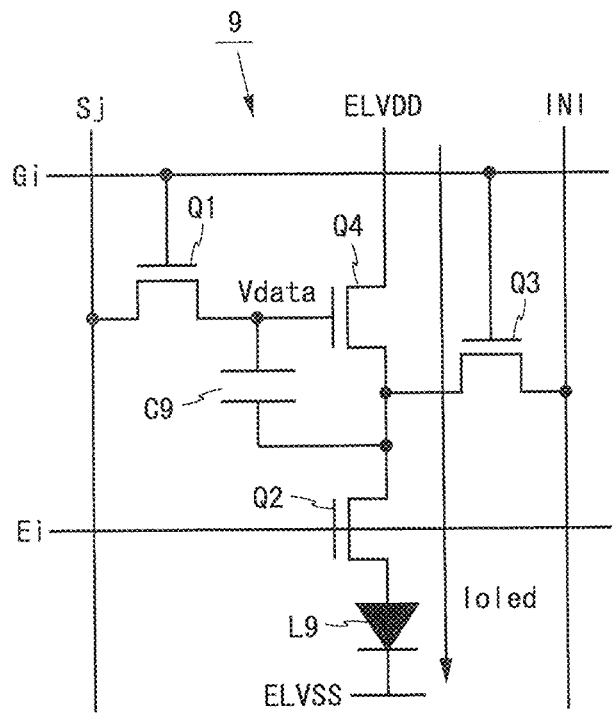
FIG. 20 is a circuit diagram of a pixel circuit of a known display device.

As described with reference to FIG. 21, the known display device including the pixel circuit 9 illustrated in FIG. 20 has a problem in that it is difficult to perform gradation control because the amount of change in the drive current Ioled with respect to the amount of change in the data voltage Vdata is large when a low-level gradation is displayed.

In contrast, in the display device 10 according to the present embodiment, when it is necessary to more accurately display a low-level gradation, the display portion 11 is set to the low luminance mode. When a low-level gradation is displayed, the amount of change in the drive current Ioled with respect to the amount of change in the data voltage Vdata is smaller in the low luminance mode than in the high luminance mode. Therefore, by setting to the low luminance mode, it is possible to easily perform gradation control at the time of displaying a low-level gradation.

As described above, the display device 10 according to the present embodiment is provided with the display panel (organic EL panel 15) including the plurality of scanning lines G1 to Gm, the plurality of data lines S1 to Sn, the plurality of light-emission control lines E1 to Em, the plurality of mode selection lines MD1 to MDm, and the plurality of pixel circuits 1, the scanning line drive circuits (the scanning line drive circuits included in the scanning line/light-emission control line drive circuits 12a, 12b) that drive the scanning lines G1 to Gm, and the data line drive circuit 13 that drives the data lines S1 to Sn. The pixel circuit 1 includes the light-emitting element (organic EL element L1), the drive transistor (TFT T4) that controls the amount of current flowing through the light-emitting element, the write control transistor (TFT T1) having one conductive terminal connected to the data line Sj and the control terminal (gate terminal) connected to the scanning line Gi, the light-emission control transistor (TFT T2) provided on the current path passing through the drive transistor and the light-emitting element and having the control terminal connected to the light-emission control line Ei, the first capacitor (capacitor C1) provided between the control terminal of the drive transistor and the conductive terminal (source terminal) thereof on the light-emitting element side, the second capacitor (capacitor C2) provided between the another conductive terminal of the write control transistor and the control terminal of the drive transistor, and the mode selection circuit that is provided in parallel with the second capacitor and causes a short-circuit and an open-circuit between the electrodes of the second capacitor in accordance with the voltage of the mode selection line MDi. The mode selection circuit includes a selection transistor (TFT T5) having one conductive terminal connected to the another conductive terminal of the write control transistor, another conductive terminal connected to the control terminal of the drive transistor, and the control terminal connected to the mode selection line MDi. The mode selection line MDi is disposed in parallel with the scanning line Gi, and either the on-voltage (high-level voltage) or the off-voltage (low-level voltage) of the selection transistor is applied to the mode selection line MDi in accordance with an operation state to be set.

According to the display device 10 and the pixel circuit 1 of the present embodiment, a short-circuit and an open-circuit are caused between the electrodes of the second capacitor using the mode selection circuit (TFT T5), whereby the amount of charges accumulated in the first capacitor is changed to change the amount of the drive current Ioled flowing through the light-emitting element. Therefore, by causing an open-circuit between the electrodes of the second capacitor in accordance with the operation state to reduce the amount of the drive current Ioled, the amount of change in the drive current Ioled with respect to the amount of change in the voltage (data voltage Vdata) of the data line is reduced to facilitate gradation control.

Figure 7:
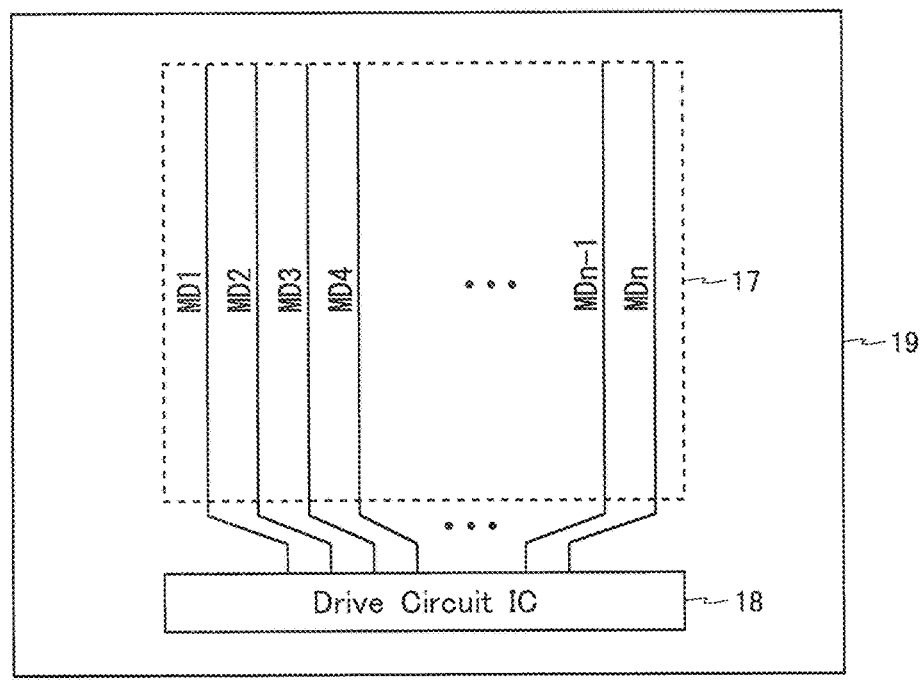
FIG. 7 is a diagram illustrating a layout of mode selection lines of a display device according to a modification of the first embodiment.
Figure 8:
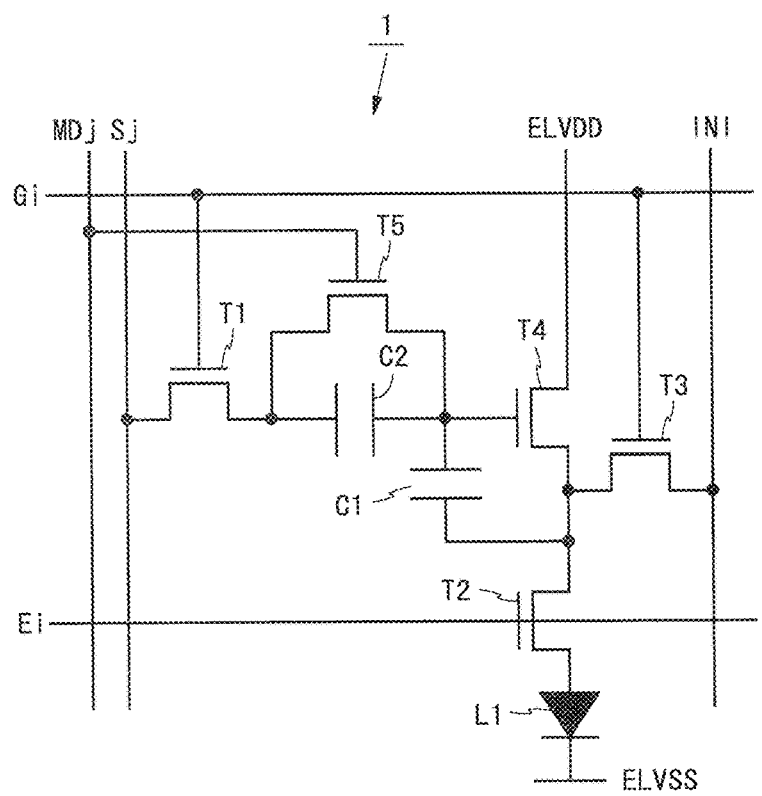
FIG. 8 is a circuit diagram of a pixel circuit of a display device according to a modification of the first embodiment.

The following modification can be configured for the display device 10 according to the present embodiment. FIG. 7 is a diagram illustrating a layout of mode selection lines of a display device according to a modification. In the display device according to the modification, a display portion 17 formed on an organic EL panel 19 includes n mode selection lines MD1 to MDn arranged in parallel with the data lines S1 to Sn. The mode selection line MDj is disposed corresponding to the data line Sj. One end (the lower ends in FIG. 7) of each of the mode selection lines MD1 to MDn is connected to a drive circuit IC 18. The drive circuit IC 18 applies the same voltage (either the high-level voltage or the low-level voltage) to the mode selection lines MD1 to MDn in accordance with an operation state to be set. In FIG. 7, the lower ends of the mode selection lines MD1 to MDn are separately connected to the drive circuit IC 18, but the lower ends of the mode selection lines MD1 to MDn may be connected to the drive circuit IC 18 via one or a plurality of wirings provided in the periphery of the display portion 17. FIG. 8 is a circuit diagram of the pixel circuit 1 of the display device according to the modification. In FIG. 8, the gate terminal of the TFT T5 is connected to the mode selection line MDj disposed in parallel with the data line Sj. The same effect as the display device 10 can be obtained with the display device according to the modification.

Second Embodiment

The display device according to the second embodiment has the same configuration (FIG. 1) as the display device 10 according to the first embodiment. The display device according to the present embodiment has a function of setting a part of the display portion to the high luminance mode and setting the remaining part to the low luminance mode. A difference from the first embodiment will be described below.

Figure 9:
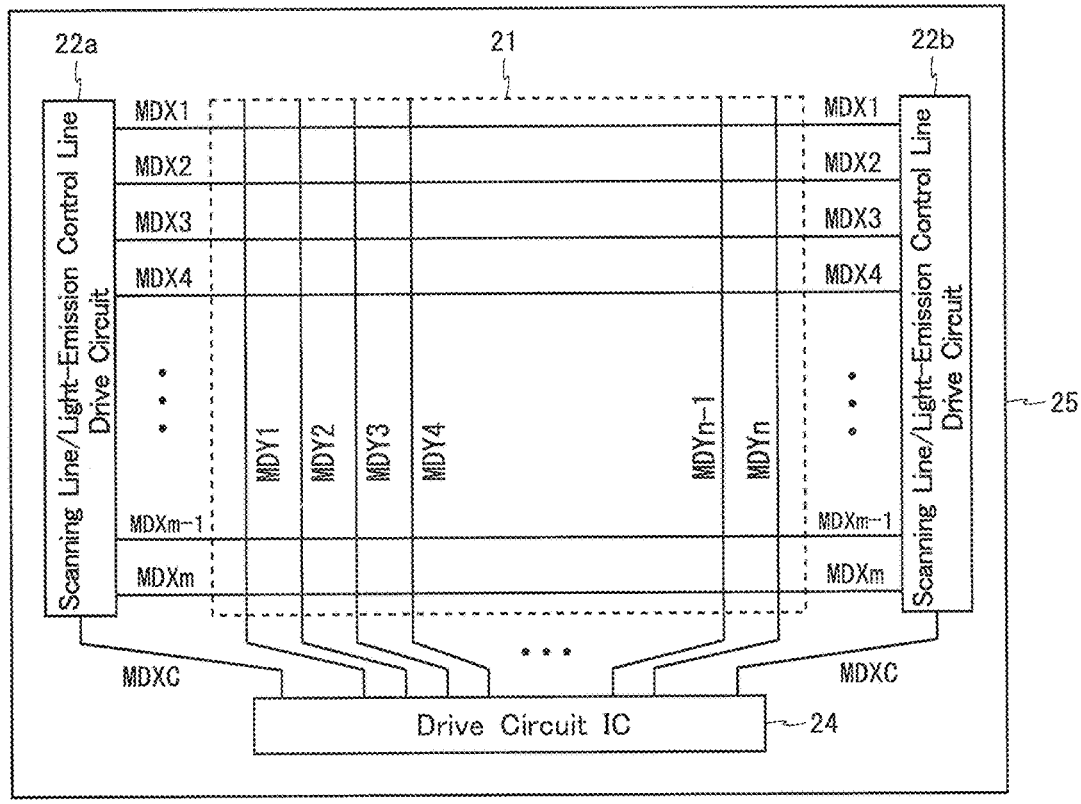
FIG. 9 is a diagram illustrating a layout of mode selection lines of a display device according to a second embodiment.

FIG. 9 is a diagram illustrating a layout of mode selection lines of the display device according to the present embodiment. In the display device according to the present embodiment, a display portion 21 formed on an organic EL panel 25 includes m first mode selection lines MDX1 to MDXm and n second mode selection lines MDY1 to MDYn. The first mode selection lines MDX1 to MDXm are arranged in parallel with the scanning lines G1 to Gm. The first mode selection line MDXi is disposed corresponding to the scanning line Gi. The second mode selection lines MDY1 to MDYn are arranged in parallel with the data lines S1 to Sn. The second mode selection line MDYj is disposed corresponding to the data line Sj.

One end (the left end in FIG. 9) of each of the first mode selection lines MDX1 to MDXm is connected to a scanning line/light-emission control line drive circuit 22a. The scanning line/light-emission control line drive circuit 22a drives the first mode selection lines MDX1 to MDXm from one end side. Another end of each of the first mode selection lines MDX1 to MDXm is connected to a scanning line/light-emission control line drive circuit 22b. The scanning line/ light-emission control line drive circuit 22b drives the first mode selection lines MDX1 to MDXm from another end side. The scanning line/light-emission control line drive circuits 22a, 22b fixedly apply either the high-level voltage or the low-level voltage to each of the first mode selection lines MDX1 to MDXm based on a control signal MDXC output from a drive circuit IC 24 in accordance with the operation state to be set. m voltages applied to the first mode selection lines MDX1 to MDXm may include the high-level voltage and the low-level voltage.

One end (the lower end in FIG. 9) of each of the second mode selection lines MDY1 to MDYn is connected to the drive circuit IC 24. The drive circuit IC 24 fixedly applies either the high-level voltage or the low-level voltage to each of the second mode selection lines MDY1 to MDYn in accordance with the operation state to be set. The n voltages applied to the second mode selection lines MDY1 to MDYn may include the high-level voltage and the low-level voltage.

Figure 10:
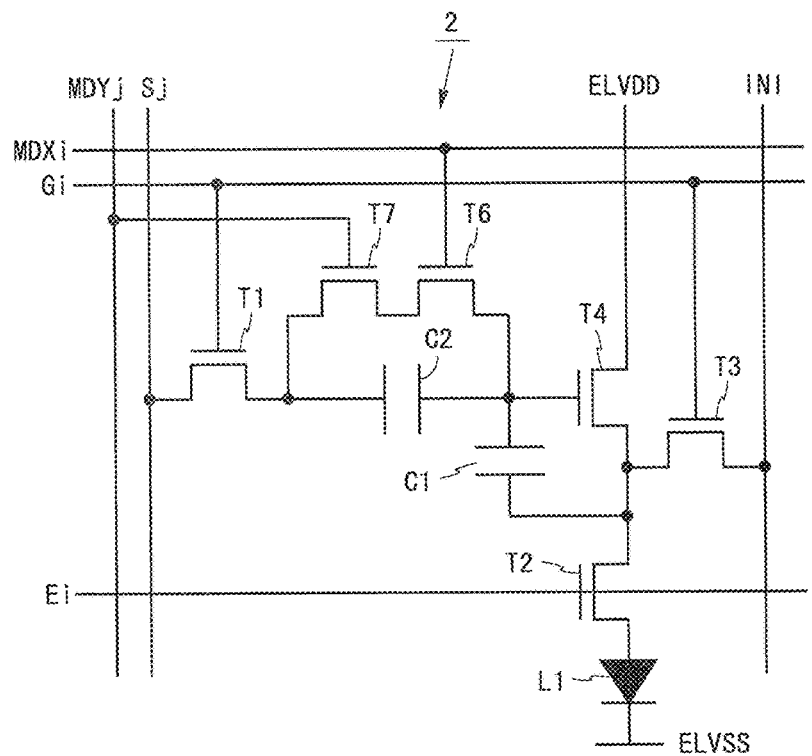
FIG. 10 is a circuit diagram of a pixel circuit of the display device according to a second embodiment.

FIG. 10 is a circuit diagram of a pixel circuit of the display device according to the present embodiment. A pixel circuit 2 illustrated in FIG. 10 is obtained by replacing TFT T5 with TFT T6, T7 in the pixel circuit 1 according to the first embodiment. TFTs T6, T7 are N-channel transistors. The another conductive terminal (the right terminal in FIG. 10) of the TFT T1 is connected to one conductive terminal (the left terminal in FIG. 10) of the TFT T7 and the one electrode (the left electrode in FIG. 10) of the capacitor C2. Another conductive terminal of the TFT T7 is connected to one conductive terminal (the left terminal in FIG. 10) of the TFT T6. Another conductive terminal of the TFT T6 is connected to the gate terminal of the TFT T4, the another electrode of the capacitor C1 (the upper electrode in FIG. 10), and the another electrode of the capacitor C2. The gate terminal of the TFT T6 is connected to the first mode selection line MDXi. The gate terminal of the TFT T7 is connected to the second mode selection line MDYj.

The TFT T6 functions as a first selection transistor having the control terminal connected to the first mode selection line MDXi. The TFT T7 functions as a second selection transistor having the control terminal connected to the second mode selection line MDYj. The first and second selection transistors are connected in series with each other and provided in parallel with the second capacitor (capacitor C2) to constitute a mode selection circuit that causes a short-circuit and an open-circuit between the electrodes of the second capacitor in accordance with the voltages of the mode selection lines (the first mode selection line MDXi and the second mode selection line MDYj). Note that the TFTs T6, T7 may be connected in the reverse order.

The TFT T6 is turned on when the voltage of the first mode selection line MDXi is at the high level and is turned off when the voltage of the first mode selection line MDXi is at the low level. The TFT T7 is turned on when the voltage of the second mode selection line MDYj is at the high level and is turned off when the voltage of the second mode selection line MDYj is at the low level. Thus, when the voltage of the first mode selection line MDXi and the voltage of the second mode selection line MDYj are both at the high level, the TFTs T6, T7 are both turned on, and the pixel circuit 2 operates in the high luminance mode. When at least one of the voltage of the first mode selection line MDXi and the voltage of the second mode selection line MDYj is at the low level, at least one of the TFTs T6, T7 is turned off, and the pixel circuit 2 operates in the low luminance mode.

Figure 11:
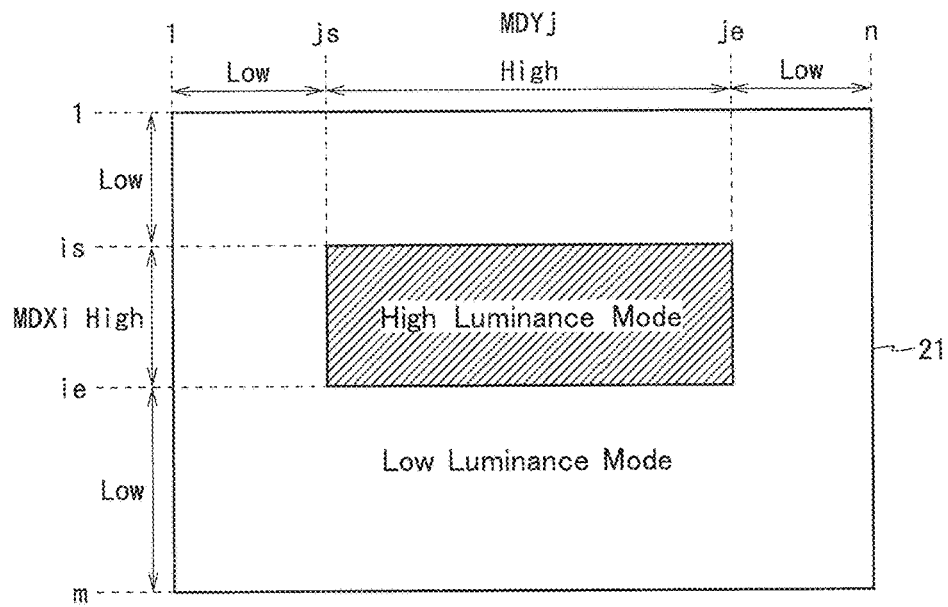
FIG. 11 is a diagram illustrating an operation state of a display portion of the display device according to the second embodiment.

FIG. 11 is a diagram illustrating the operation state of the display portion 21. In the example illustrated in FIG. 11, the voltage of the first mode selection line MDXi is at the high level when is≤i≤ie, and is at the low level otherwise. The voltage of the second mode selection line MDYj is at the high level when js≤j≤je, and is at the low level otherwise. In this case, the shaded portion (a portion of is≤i≤ie and js≤j≤je) of the display portion 21 is set to the high luminance mode, and the remaining portion is set to the low luminance mode. The pixel circuits 2 in the shaded portion operate in the high luminance mode, and the remaining pixel circuits 2 operate in the low luminance mode. As described above, in the display device according to the present embodiment, a part of the display portion 21 is set to the high luminance mode, and the remaining part is set to the low luminance mode.

As described above, in the display device according to the present embodiment, the plurality of mode selection lines include the plurality of first mode selection lines MDX1 to MDXm arranged in parallel with the scanning lines G1 to Gm and the plurality of second mode selection lines MDY1 to MDYn arranged in parallel with the data lines S1 to Sn. The mode selection circuit includes the first selection transistor (TFT T6) having the control terminal (gate terminal) connected to the first mode selection line MDXi and the second selection transistor (TFT T7) having the control terminal connected to the second mode selection line MDYj, and the first and second selection transistors are connected in series with each other and provided in parallel with the second capacitor (capacitor C2). Either the on-voltage (high-level voltage) or the off-voltage (low-level voltage) of the first selection transistor and either the on-voltage (high-level voltage) or the off-voltage (low-level voltage) of the second selection transistor are applied to the first mode selection line MDXi and the second mode selection line MDYj in accordance with the operation state to be set.

According to the display device of the present embodiment, similarly to the first embodiment, the amount of the drive current flowing through the light-emitting element is reduced by causing an open-circuit between the electrodes of the second capacitor in accordance with the operation state, whereby the amount of change in the drive current with respect to the amount of change in the voltage of the data line is reduced to facilitate gradation control. In addition, by setting a part of the display portion to the high luminance mode and setting the remaining part to the low luminance mode, it is possible to more accurately display a low-level gradation in the part set to the low luminance mode.

Third Embodiment

The display device according to the third embodiment has the same configuration (FIG. 1) as the display device 10 according to the first embodiment. Similarly to the display device according to the second embodiment, the display portion includes first mode selection lines MDX1 to MDXm and second mode selection lines MDY1 to MDYn (FIG. 9). The display device according to the present embodiment has a function of setting each pixel circuit to either the high luminance mode or the low luminance mode. A difference from the first and second embodiments will be described below.

Figure 12:
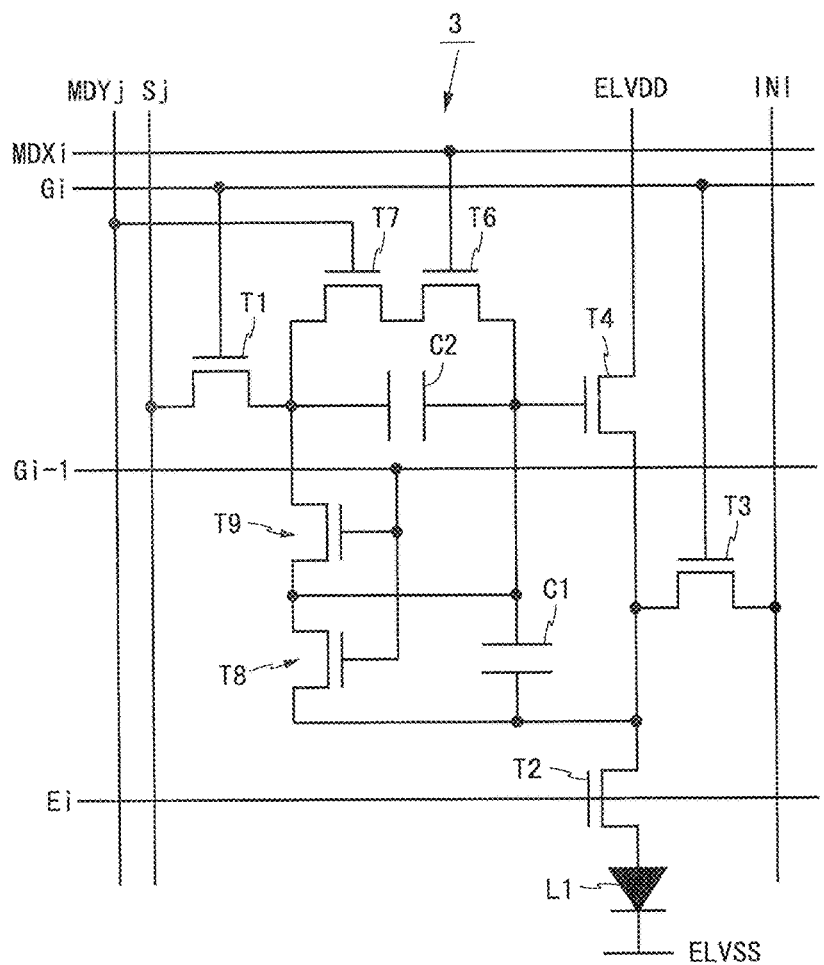
FIG. 12 is a circuit diagram of a pixel circuit of a display device according to a third embodiment.

FIG. 12 is a circuit diagram of a pixel circuit of the display device according to the present embodiment. A pixel circuit 3 illustrated in FIG. 12 is obtained by adding two TFTs T8, T9 to the pixel circuit 2 according to the second embodiment. TFTs T8, T9 are N-channel transistors. Two conductive terminals of the TFT T8 are connected to the two electrodes of the capacitor C1, respectively. Two conductive terminals of the TFT T9 are connected to the two electrodes of the capacitor C2, respectively. The gate terminals of the TFTs T8, T9 are connected to the scanning line Gi−1.

The TFT T8 functions as a first reset transistor that causes a short-circuit and an open-circuit between the electrodes of the first capacitor (capacitor C1) in accordance with a voltage of a control line (scanning line Gi−1) selected before the scanning line Gi. The TFT T9 functions as a second reset transistor that causes a short-circuit and an open-circuit between the electrodes of the second capacitor (capacitor C2) in accordance with the voltage of the control line. The control line is the preceding scanning line Gi−1 selected one horizontal period before the scanning line Gi.

Figure 13:
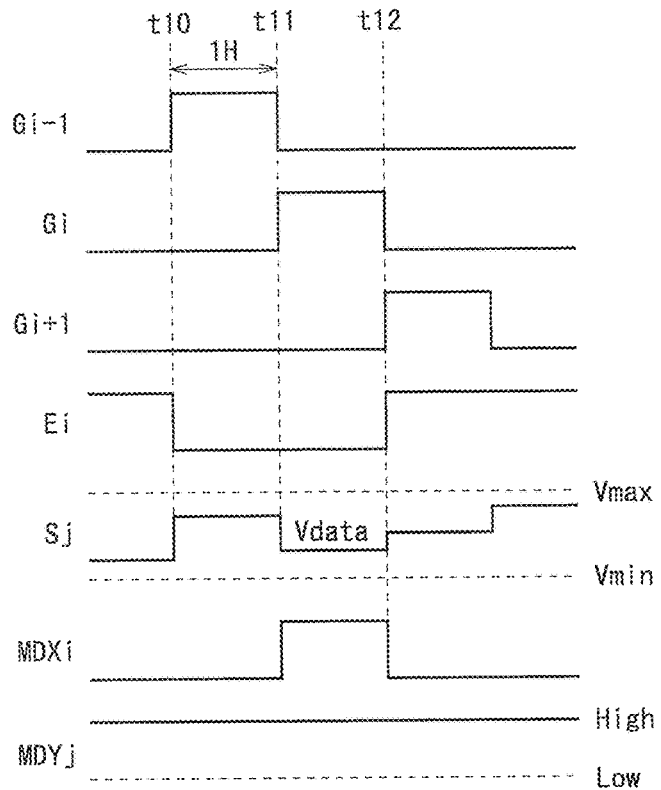
FIG. 13 is a timing chart when a high luminance mode is set in the display device according to the third embodiment.
Figure 14:
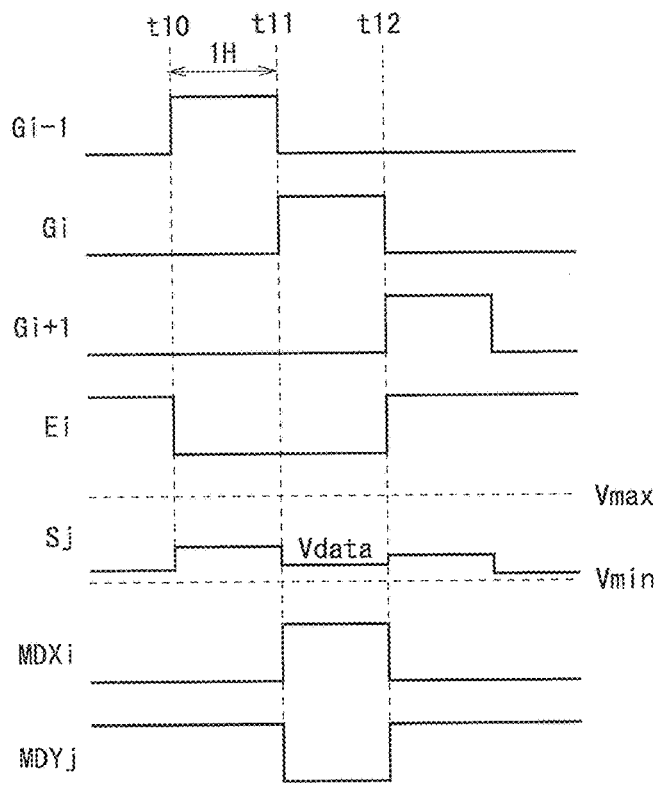
FIG. 14 is a timing chart when a low luminance mode is set in the display device according to the third embodiment.

FIG. 13 is a timing chart when the high luminance mode is set in the display device according to the present embodiment. FIG. 14 is a timing chart when the low luminance mode is set in the display device according to the present embodiment. FIGS. 13 and 14 illustrate timings of writing voltages while the pixel circuit 3 in the ith row and the jth column is set to the high luminance mode or the low luminance mode.

As illustrated in FIGS. 13 and 14, the voltages of the scanning lines Gi−1, Gi, Gi+1 are sequentially controlled to the high level each for one horizontal period. A period from time t10 to time t11 is a selection period Pi−1 of the pixel circuits 3 in the (i−1)th row. A period from time t11 to time t12 is a selection period Pi of the pixel circuits 3 in the ith row.

During the selection period Pi−1, the voltage of the scanning line Gi−1 is controlled to the high level. Thus, the TFTs T8, T9 are turned on. When the TFT T8 is turned on, a short-circuit is caused between the electrodes of the capacitor C1, and the charges accumulated in the capacitor C1 are discharged. When the TFT T9 is turned on, a short-circuit is caused between the electrodes of the capacitor C2, and the charges accumulated in the capacitor C2 are discharged.

During the selection period Pi, the voltages of the scanning line Gi and the first mode selection line MDXi are controlled to the high level, the voltage of the data line Sj is controlled to the data voltage Vdata, the voltages of the scanning line Gi−1 and the light-emission control line Ei are controlled to the low level, and the voltage of the second mode selection line MDYj is controlled to either the high level or the low level. Thus, the TFTs T1, T3, T6 are turned on, the TFTs T2, T8, T9 are turned off, and the TFT T7 is turned on or off. At this time, no drive current flows through the organic EL element L1, and hence the organic EL element L1 does not emit light.

When the TFT T3 is turned on at time t11, the voltages at the source terminal of the TFT 14 and the drain terminal of the TFT T2 become equal to the initialization voltage applied to the initialization line INI. When the TFT T1 is turned on at time t11, the voltage Vdata of the data line Sj is written to the pixel circuit 3 via the TFT T1. The capacitor C1 accumulates charges corresponding to the data voltage Vdata. The capacitor C2 does not accumulate charges when the TFT T7 is in the on-state (when the high luminance mode is set), and accumulates charges corresponding to the data voltage Vdata when the TFT T7 is in the off-state (when the low luminance mode is set).

At time t12, the voltages of the scanning line Gi and the first mode selection line MDXi change to the low level, and the voltage of the light-emission control line Ei changes to the high level. Thus, the TFTs T1, T3, T6 are turned off, and the TFT T2 is turned on. After time t12, the drive current Ioled corresponding to the gate-source voltage of the TFT 14 flows through a current path passing through the TFT 14, the TFT T2, and the organic EL element L1, and the organic EL element L1 emits light with luminance corresponding to the drive current Ioled. Since the TFT T6 is turned off at time t12, the pixel circuit 3 is not affected even when the voltage of the second mode selection line MDYj changes after time t12.

As described above, either the high-level voltage or the low-level voltage is applied to each of the first mode selection lines MDX1 to MDXm in line with the drive timing of the scanning lines G1 to Gm. Either the high-level voltage or the low-level voltage is applied to each of the second mode selection lines MDY1 to MDYn in accordance with the operation state to be set in line with the drive timing of the scanning lines G1 to Gm. The pixel circuit 3 in the ith row and the jth column operates in the high luminance mode when the voltage of the second mode selection line MDYj is at the high level during the selection period Pi, and operates in the low luminance mode when the voltage of the second mode selection line MDYj is at the low level during the selection period Pi. As described above, the display device according to the present embodiment sets each pixel circuit 3 to either the high luminance mode or the low luminance mode.

The first mode selection lines MDX1 to MDXm are driven using, for example, the scanning line drive circuit that drives the scanning lines G1 to Gm. The first mode selection lines MDX1 to MDXm may be driven using a mode selection line drive circuit that performs the same operation as the scanning line drive circuit that drives the scanning lines G1 to Gm. The first mode selection lines MDX1 to MDXm may be driven using a scanning line drive circuit to which a function of driving the mode selection lines MDX1 to MDXm is added. The drive circuit of the first mode selection lines MDX1 to MDXm may sequentially apply the high-level voltage to all of the first mode selection lines MDX1 to MDXm within one frame period, or may sequentially apply the high-level voltage to a part of the first mode selection lines MDX1 to MDXm and apply the low-level voltage to the remaining first mode selection lines within one frame period.

Figure 15:
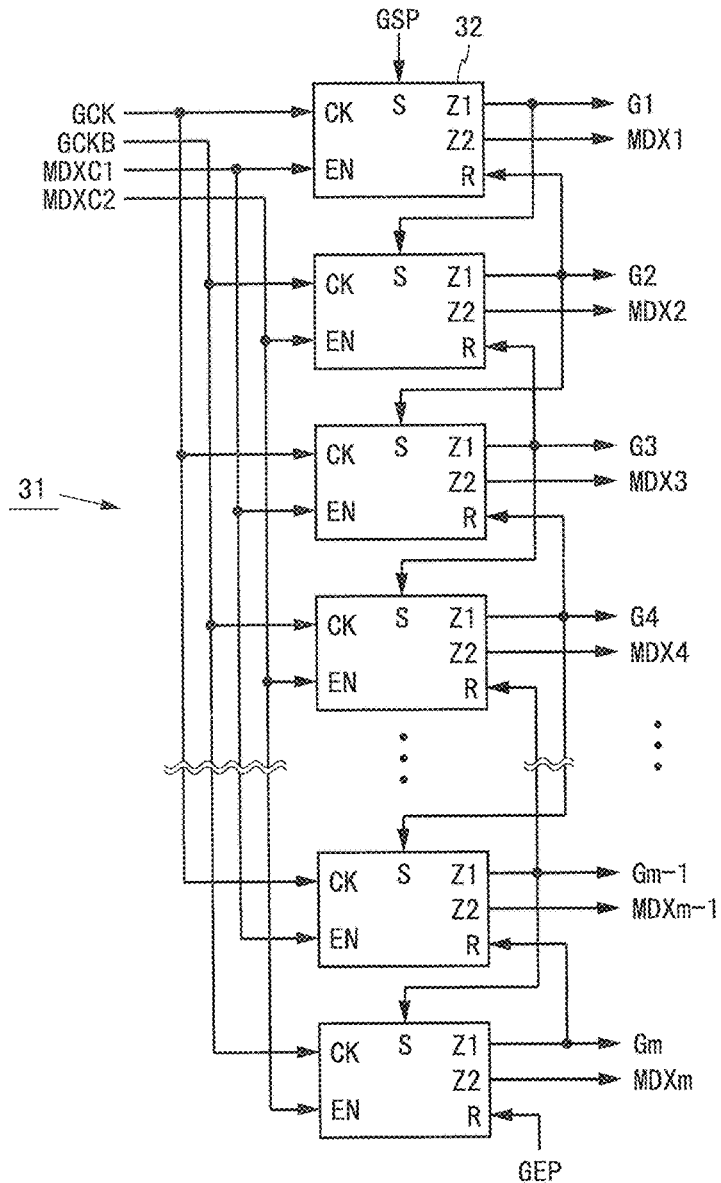
FIG. 15 is a block diagram illustrating a configuration of a scanning line drive circuit of the display device according to the third embodiment.
Figure 16:
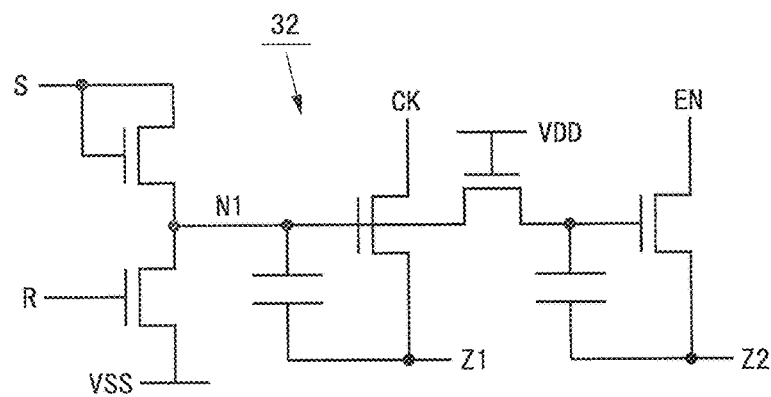
FIG. 16 is a circuit diagram of a unit circuit of the scanning line drive circuit illustrated in FIG. 15.
Figure 17:
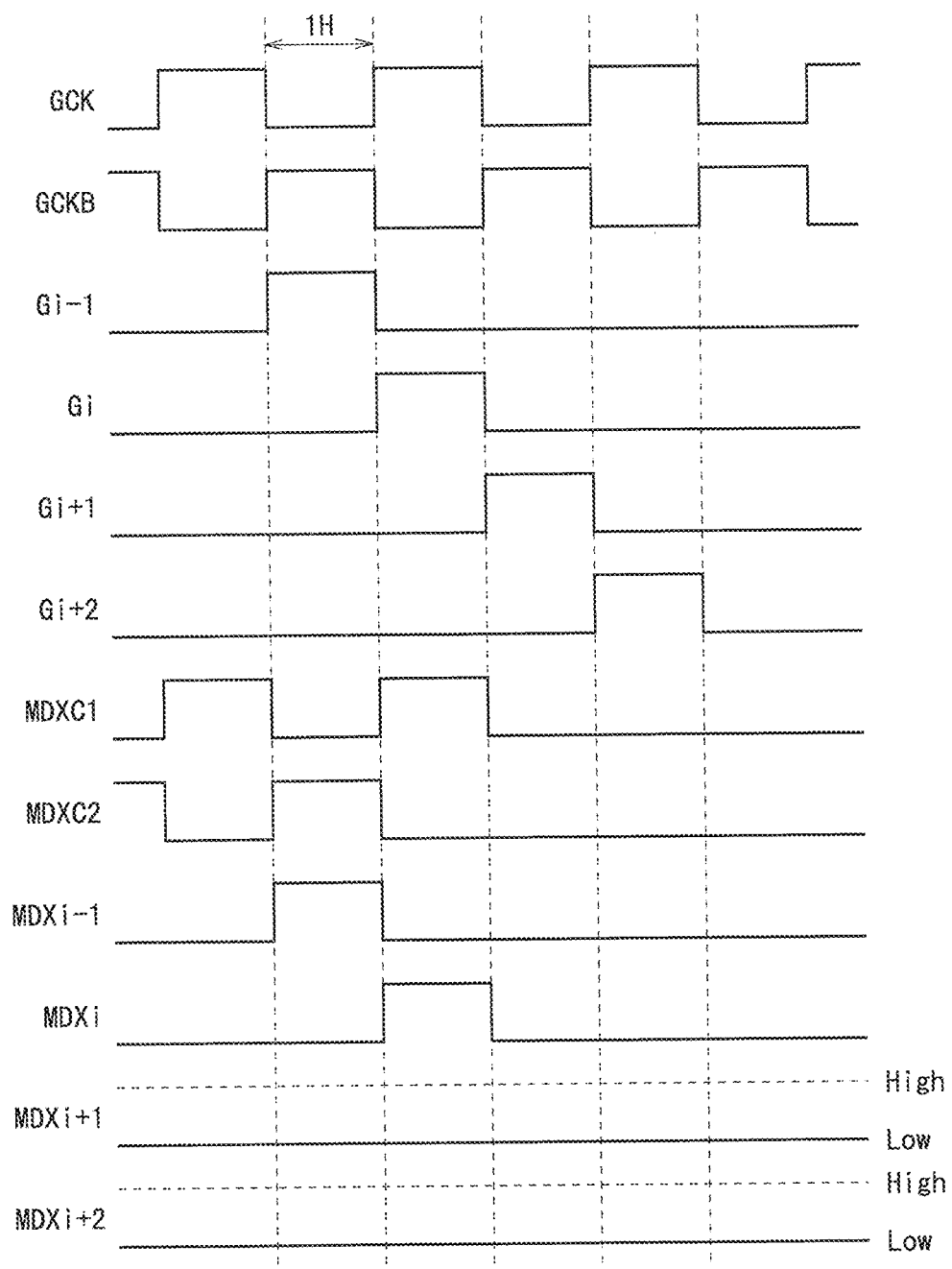
FIG. 17 is a timing chart of the scanning line drive circuit illustrated in FIG. 15.

An example of a scanning line drive circuit having a function of driving the first mode selection lines MDX1 to MDXm will be described with reference to FIGS. 15 to 17. FIG. 15 is a block diagram illustrating the configuration of the scanning line drive circuit. A scanning line drive circuit 31 illustrated in FIG. 15 has a configuration in which m unit circuits 32 are connected in multiple stages. FIG. 16 is a circuit diagram of the unit circuit 32. FIG. 17 is a timing chart of the scanning line drive circuit 31.

As illustrated in FIG. 15, the unit circuit 32 includes a clock terminal CK, an enable terminal EN, a set terminal S, a reset terminal R, and two output terminals Z1, Z2. A gate clock GCK, an inverted signal GCKB thereof, a gate start pulse GSP, a gate end pulse GEP, and control signals MDXC1, MDXC2 are supplied from a drive circuit IC (not illustrated) to the scanning line drive circuit 31. The gate clock GCK is a clock signal with a cycle of two horizontal periods.

The gate clock GCK is input to the clock terminal CK of the unit circuit 32 at the odd-numbered stage. The inverted signal GCKB of the gate clock is input to the clock terminal CK of the unit circuit 32 at the even-numbered stage. The control signal MDXC1 is input to the enable terminal EN of the unit circuit 32 at the odd-numbered stage. The control signal MDXC2 is input to the enable terminal EN of the unit circuit 32 at the even-numbered stage. The gate start pulse GSP is input to the set terminal S of the unit circuit 32 at the first stage. The unit circuit 32 at each of the second to mth stages has the set terminal S supplied with a signal output from the output terminal Z1 of the unit circuit 32 at the preceding stage. The gate end pulse GEP is input to the reset terminal R of the unit circuit 32 at the mth stage. The unit circuit 32 at each of the first to (m−1)th stages has the reset terminal R supplied with a signal output from the output terminal Z1 of the unit circuit 32 at the next stage. The output terminals Z1 of the unit circuits 32 at the first to mth stages are connected to the scanning lines G1 to Gm, respectively. The output terminals Z2 of the unit circuits 32 at the first to mth stages are connected to the first mode selection lines MDX1 to MDXm, respectively.

In the unit circuit 32, the output signal of the unit circuit at the previous stage is input from the set terminal S, and the output signal of the unit circuit at the next stage is input from the reset terminal R. The voltage of the node N1 illustrated in FIG. 16 is at the high level during two horizontal periods from when the output signal of the unit circuit at the previous stage changes to the high level to when the output signal of the unit circuit of the next stage changes to the high level. The voltage of the output terminal Z1 is at the high level when the voltages of the node N1 and the signal input from the clock terminal CK are at the high level, and is at the low level otherwise. The voltage of the output terminal Z2 is at the high level when the voltages of the node N1 and the signal input from the enable terminal EN are at the high level, and is at the low level otherwise.

As illustrated in FIG. 17, the voltages of the scanning lines Gi−1, Gi, Gi+1, and Gi+2 are sequentially controlled to the high level each for one horizontal period. The control signal MDXC1 changes similarly to the gate clock GCK until the selection period Pi, and is fixed to the low level thereafter. The control signal MDXC2 changes similarly to the inverted signal GCKB of the gate clock until the selection period Pi−1, and is fixed to the low level thereafter. In this case, the voltages of the first mode selection lines MDXi−1 and MDXi are at the high level during the selection periods Pi−1 and Pi respectively, and are at the low level otherwise. The voltages of the first mode selection lines MDXi+1, MDXi+2 are always at the low level.

According to the scanning line drive circuit 31, by suitably setting a period during which each of the voltages of the control signals MDXC1, MDXC2 is controlled to the high level, it is possible to sequentially apply the high-level voltage to a part of the first mode selection lines MDX1 to MDXm within one frame period, so as to set the pixel circuits 3 in rows within a certain range of the display portion to either the high luminance mode or the low luminance mode.

As described above, in the display device according to the present embodiment, the pixel circuit 3 further includes the first reset transistor (TFT T8) that causes a short-circuit and an open-circuit between the electrodes of the first capacitor (capacitor C1) in accordance with the voltage of the control line (scanning line Gi−1) selected before the scanning line Gi, and the second reset transistor (TFT T9) that causes a short-circuit and an open-circuit between the electrodes of the second capacitor (capacitor C2) in accordance with the voltage of the control line. Either the on-voltage (high-level voltage) or the off-voltage (low-level voltage) of the first selection transistor (TFT T6) is applied to the first mode selection line MDXi in line with the drive timing of the scanning line Gi. Either the on-voltage or the off-voltage of the second selection transistor (TFT T7) is applied to the second mode selection line MDYj in accordance with the operation state to be set in line with the drive timing of the scanning line Gi. The control line is the preceding scanning line Gi−1 selected one horizontal period before the scanning line Gi.

According to the display device of the present embodiment, similarly to the first and second embodiments, the amount of the drive current flowing through the light-emitting element is reduced by causing an open-circuit between the electrodes of the second capacitor in accordance with the operation state, whereby the amount of change in the drive current with respect to the amount of change in the voltage of the data line is reduced to facilitate gradation control. In addition, by setting each pixel circuit 3 to either the high luminance mode or the low luminance mode, it is possible to more accurately display a low-level gradation in a portion set to the low luminance mode.

Fourth Embodiment

The display device according to the fourth embodiment has the same configuration (FIG. 1) as the display device 10 according to the first embodiment. Similarly to the display device according to the modification of the first embodiment, the display portion includes the mode selection lines MD1 to MDn arranged in parallel with the data lines S1 to Sn (FIG. 7). In the display device according to the present embodiment, the scanning lines G1 to Gm and the first mode selection lines MDX1 to MDXm in the display device according to the third embodiment are made common. A difference from the third embodiment will be described below.

Figure 18:
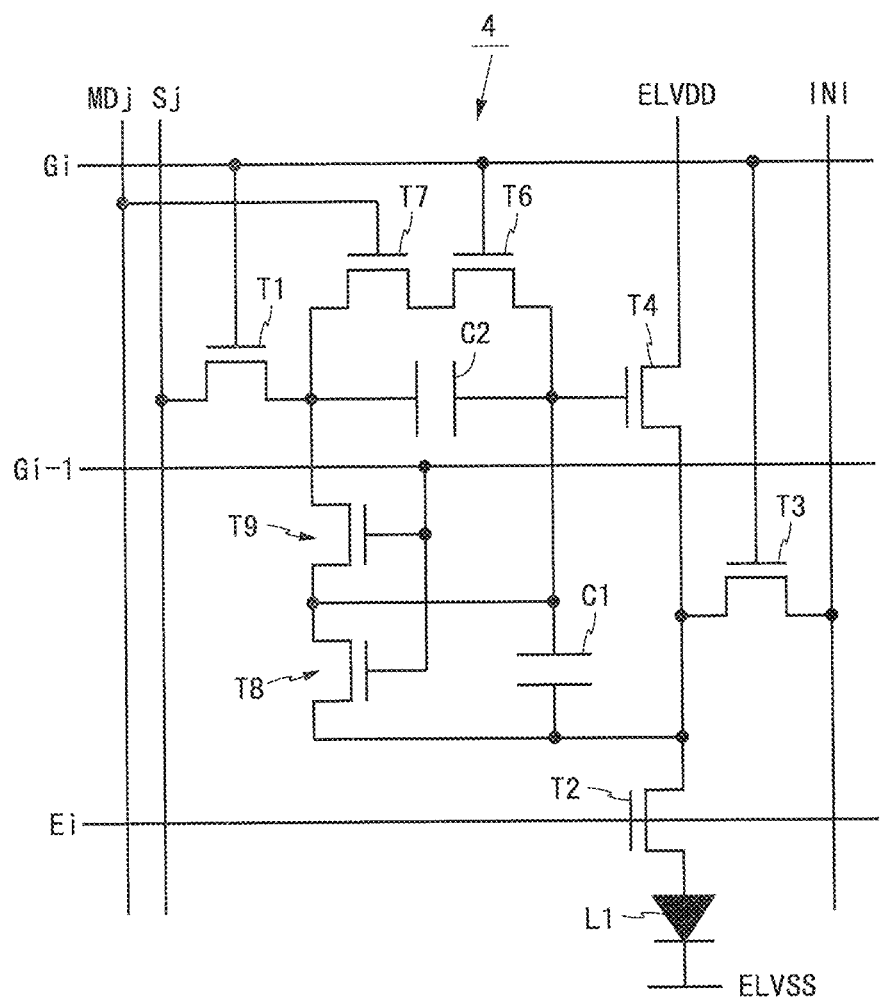
FIG. 18 is a circuit diagram of a pixel circuit of a display device according to a fourth embodiment.

FIG. 18 is a circuit diagram of a pixel circuit of the display device according to the present embodiment. A pixel circuit 4 illustrated in FIG. 18 is obtained by connecting the gate terminal of the TFT T6 to the scanning line Gi and connecting the gate terminal of the TFT T7 to the mode selection line MDj in the pixel circuit 3 according to the third embodiment. Thus, the gate terminal of the TFT T7 is connected to the mode selection line MDj disposed in parallel with the data line Sj.

As described above, in the display device according to the present embodiment, the mode selection line MDj is disposed in parallel to the data line Sj, the mode selection circuit includes the first selection transistor (TFT T6) having the control terminal (gate terminal) connected to the scanning line Gi, the second selection transistor (TFT T7) having the control terminal connected to the mode selection line MDj, the first reset transistor (TFT T8) that causes a short-circuit and an open-circuit between electrodes of the first capacitor (capacitor C1) in accordance with the voltage of the control line (scanning line Gi−1) selected before the scanning line Gi, and the second reset transistor (TFT T9) that causes a short-circuit and an open-circuit between electrodes of the second capacitor (capacitor C2) in accordance with the voltage of the control line, and the first selection transistor and the second selection transistor are connected in series with each other and provided in parallel with the second capacitor (capacitor C2). Either the on-voltage (high-level voltage) or the off-voltage (low-level voltage) of the second selection transistor is applied to the mode selection line MDj in accordance with the operation state to be set in line with the drive timing of the scanning line Gi. The control line is the preceding scanning line Gi−1 selected one horizontal period before the scanning line Gi.

The display device of the present embodiment can produce the same effect as the display device according to the third embodiment. In addition, the layout area of the circuit that drives the mode selection line and the display portion can be reduced because no mode selection lines parallel to the scanning lines G1 to Gm are provided.

Fifth Embodiment

A display device according to a fifth embodiment is obtained by replacing the N-channel transistor included in the pixel circuit with a P-channel transistor in the display device according to the third embodiment. A difference from the third embodiment will be described below.

Figure 19:
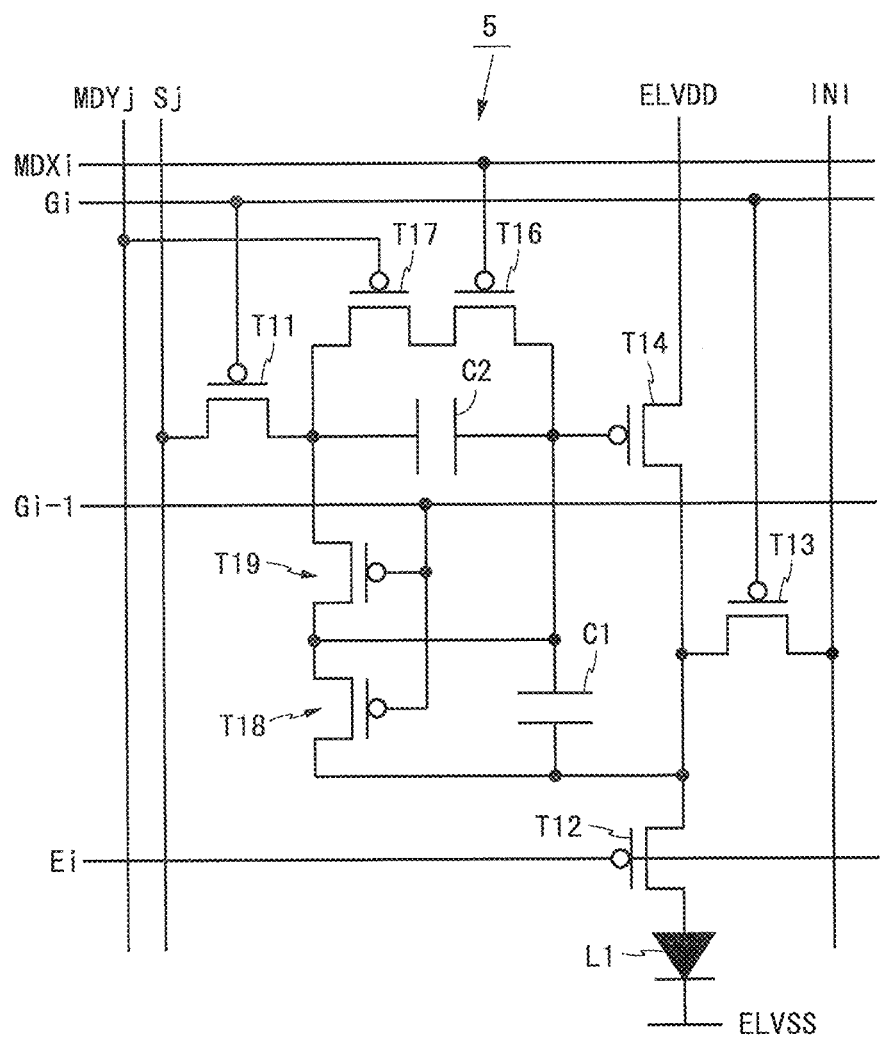
FIG. 19 is a circuit diagram of a pixel circuit of a display device according to a fifth embodiment.

FIG. 19 is a circuit diagram of a pixel circuit of the display device according to the present embodiment. The pixel circuit 5 illustrated in FIG. 19 includes eight TFTs T11 to T14, T16 to T19, two capacitors C1, C2, and an organic EL element L1. TFTs T11 to T14 and T16 to T19 are all P-channel transistors. The connection form of the TFTs T11 to T14, T16 to T19, the capacitors C1, C2, and the organic EL element L1 in the pixel circuit 4 is the same as the connection form of the TFTs T1 to T4, T6 to T9, the capacitors C1, C2, and the organic EL element L1 in the pixel circuit 3 (FIG. 12) according to the third embodiment.

The polarities of the voltages of the scanning lines Gi−1, Gi, the light-emission control line Ei, the first mode selection line MDXi, and the second mode selection line MDYj supplied to the pixel circuit 5 are opposite to the polarities of the voltages of these lines supplied to the pixel circuit 3. The data voltage Vdata is controlled to a low voltage when a high-level gradation is displayed, and is controlled to a high voltage when a low-level gradation is displayed. For example, the voltage of the first mode selection line MDXi is controlled to the low level during the selection period Pi of the pixel circuit 5 in the ith row, and is controlled to the high level during other periods. The pixel circuit 5 in the ith row and the jth column operates in the high luminance mode when the voltage of the second mode selection line MDYj is at the low level during the selection period Pi, and operates in the low luminance mode when the voltage of the second mode selection line MDYj is at the high level during the selection period Pi.

The display device of the present embodiment can produce the same effect as the display device according to the third embodiment. In the display devices according to the first, second, and fourth embodiments, the N-channel transistor included in the pixel circuit may be replaced with a P-channel transistor in a similar manner.

Various modifications can be constituted for the display device and the pixel circuit according to each embodiment described above. The pixel circuit of the display device according to the modification may have another configuration as long as the pixel circuit includes the light-emitting element, the drive transistor, the write control transistor, the first capacitor, the second capacitor, and the mode selection circuit connected in the manner described above. For example, the pixel circuit of the display device according to the modification may not include the TFT T2. In this case, the display device only needs to be provided with a display panel not including the light-emission control line and be provided with a scanning line drive circuit instead of the scanning line/light-emission control line drive circuit.

Although the organic EL display device provided with the pixel circuit including the organic EL element (organic light-emitting diode) has been described as an example of the display device provided with the pixel circuit including the light-emitting element, an inorganic EL display device provided with a pixel circuit including an inorganic light-emitting diode, a quantum-dot light-emitting diode (QLED) display device provided with a pixel circuit including a quantum dot light-emitting diode, or a light-emitting diode (LED) display device provided with a pixel circuit including a mini LED or a micro LED may be configured in a similar manner. The features of the display devices and the pixel circuits described above may be arbitrarily combined as long as the features are not contrary to the nature thereof to constitute a display device and a pixel circuit having the features of the above embodiments and modifications.

DESCRIPTION OF REFERENCE CHARACTERS 1, 2, 3, 4, 5 PIXEL CIRCUIT
10 DISPLAY DEVICE
11, 17, 21 DISPLAY PORTION
12, 22 SCANNING LINE/LIGHT-EMISSION CONTROL LINE DRIVE CIRCUIT
13 DATA LINE DRIVE CIRCUIT
14, 18, 24 DRIVE CIRCUIT IC
15, 19, 25 ORGANIC EL PANEL
31 SCANNING LINE DRIVE CIRCUIT

The invention claimed is:
1. A display device comprising:
a display panel that includes a plurality of scanning lines, a plurality of data lines, a plurality of mode selection lines, and a plurality of pixel circuits; and
a drive circuit configured to drive the scanning lines, the data lines, and the mode selection lines; wherein
the drive circuit includes:
  a scanning line drive circuit configured to drive the scanning lines; and
  a data line drive circuit configured to drive the data lines,
each of the pixel circuits includes:
  a light-emitting element,
  a drive transistor configured to control an amount of current flowing through the light-emitting element,
  a write control transistor having one conductive terminal connected to one of the data lines and a control terminal connected to one of the scanning lines,
  a first capacitor provided between a control terminal of the drive transistor and a conductive terminal of the drive transistor,
  a second capacitor provided between another conductive terminal of the write control transistor and the control terminal of the drive transistor, and
  a mode selection circuit provided in parallel with the second capacitor and configured to cause a short-circuit and an open-circuit between electrodes of the second capacitor in accordance with a voltage of one of the mode selection lines,
the scanning line drive circuit drives the scanning lines such that the write control transistor is in an ON state during a write period, which is a period in which a voltage that determines the current flowing through the light emitting element is to be written to the first capacitor,
the data line drive circuit drives the data lines such that a data voltage corresponding to the voltage to be written to the first capacitor in the write period is applied to the one of the data signal lines, and
the drive circuit drives the mode selection lines such that a first luminance mode and a second luminance mode are selectively set and such that in the first luminance mode the mode selection circuit causes fixedly a short-circuit between the electrodes of the second capacitor during the write period and in the second luminance mode the mode selection circuit causes fixedly an open-circuit between the electrodes of the second capacitor during the write period.

2. The display device according to claim 1, wherein the mode selection circuit includes a selection transistor having one conductive terminal connected to the another conductive terminal of the write control transistor, another conductive terminal connected to the control terminal of the drive transistor, and a control terminal connected to the one of the mode selection lines.

3. The display device according to claim 2, wherein the mode selection lines are disposed in parallel with the scanning lines.

4. The display device according to claim 2, wherein the mode selection lines are disposed in parallel with the data lines.

5. The display device according to claim 2, wherein either an on-voltage or an off-voltage of the selection transistor is applied to the one of the mode selection lines in accordance with an operation state to be set.

6. The display device according to claim 1, wherein the plurality of mode selection lines includes a plurality of first mode selection lines arranged in parallel to the scanning lines, and a plurality of second mode selection lines arranged in parallel with the data lines, the mode selection circuit includes a first selection transistor having a control terminal connected to one of the first mode selection lines, and a second selection transistor having a control terminal connected to one of the second mode selection lines, and the first selection transistor and the second selection transistor are connected in series with each other and provided in parallel with the second capacitor.

7. The display device according to claim 6, wherein either an on-voltage or an off-voltage of the first selection transistor and either an on-voltage or an off-voltage of the second selection transistor are applied to the first mode selection line and the second mode selection line in accordance with an operation state to be set.

8. The display device according to claim 6, wherein each of the pixel circuits includes
a first reset transistor configured to cause a short-circuit and an open-circuit between electrodes of the first capacitor in accordance with a voltage of a control line selected before the one of the scanning lines, and
a second reset transistor configured to cause a short-circuit and an open-circuit between the electrodes of the second capacitor in accordance with the voltage of the control line,
either an on-voltage or an off-voltage of the first selection transistor is applied to the first mode selection line in line with a drive timing of the one of the scanning lines, and
either an on-voltage or an off-voltage of the second selection transistor is applied to the second mode selection line in accordance with an operation state to be set in line with a drive timing of the one of the scanning lines.

9. The display device according to claim 8, wherein the control line is a preceding scanning line selected one horizontal period before the one of the scanning lines.

10. The display device according to claim 1, wherein the mode selection lines are disposed parallel to the data lines, and
the mode selection circuit includes
a first selection transistor having a control terminal connected to the one of the scanning lines, and
a second selection transistor having a control terminal connected to the one of the mode selection lines, and
the first selection transistor and the second selection transistor are connected in series with each other and provided in parallel with the second capacitor.

11. The display device according to claim 10, wherein each of the pixel circuits includes
a first reset transistor configured to cause a short-circuit and an open-circuit between electrodes of the first capacitor in accordance with a voltage of a control line selected before the one of the scanning lines, and
a second reset transistor configured to cause a short-circuit and an open-circuit between the electrodes of the second capacitor in accordance with the voltage of the control line, and
either an on-voltage or an off-voltage of the second selection transistor is applied to the one of the mode selection lines in accordance with an operation state to be set in line with a drive timing of the one of the scanning lines.

12. The display device according to claim 11, wherein the control line is a preceding scanning line selected one horizontal period before the one of the scanning lines.

13. The display device according to claim 1, wherein
the display panel further includes a plurality of light-emission control lines, and
each of the pixel circuits further includes a light-emission control transistor that is provided on a current path passing through the drive transistor and the light-emitting element and has a control terminal connected to one of the light-emission control lines.

14. The display device according to claim 1, wherein the first capacitor has one electrode and another electrode respectively connected to the control terminal and the conductive terminal of the drive transistor, the conductive terminal of the drive transistor being on the light-emitting element side.

15. A pixel circuit provided in a display panel, the pixel circuit comprising:
a light-emitting element;
a drive transistor configured to control an amount of current flowing through the light-emitting element;
a write control transistor having one conductive terminal connected to one of a plurality of data lines included in the display panel and a control terminal connected to one of a plurality of scanning lines included in the display panel;
a first capacitor provided between a control terminal of the drive transistor and a conductive terminal of the drive transistor;
a second capacitor provided between another conductive terminal of the write control transistor and the control terminal of the drive transistor; and
a mode selection circuit provided in parallel with the second capacitor and configured to cause a short-circuit and an open-circuit between electrodes of the second capacitor in accordance with a voltage of one of a plurality of mode selection lines included in the display panel, wherein
the mode selection circuit includes:
a first selection transistor having a control terminal connected to one of first mode selection lines included in the mode selection lines, and a second selection transistor having a control terminal connected to one of second mode selection lines included in the mode selection lines, and the first selection transistor and the second selection transistor are connected in series with each other and provided in parallel with the second capacitor.

16. The pixel circuit according to claim 15, further comprising:

a first reset transistor configured to cause a short-circuit and an open-circuit between electrodes of the first capacitor in accordance with a voltage of a control line; and a second reset transistor configured to cause a short-circuit and an open-circuit between the electrodes of the second capacitor in accordance with the voltage of the control line.

17. The pixel circuit according to claim 15, wherein the first capacitor has one electrode and another electrode respectively connected to the control terminal and the conductive terminal of the drive transistor, the conductive terminal of the drive transistor being on the light-emitting element side.

18. A pixel circuit provided in a display panel, the pixel circuit comprising:

a light-emitting element;

a drive transistor configured to control an amount of current flowing through the light-emitting element;

a write control transistor having one conductive terminal connected to one of a plurality of data lines included in the display panel and a control terminal connected to one of a plurality of scanning lines included in the display panel;

a first capacitor provided between a control terminal of the drive transistor and a conductive terminal of the drive transistor;

a second capacitor provided between another conductive terminal of the write control transistor and the control terminal of the drive transistor; and a mode selection circuit provided in parallel with the second capacitor and configured to cause a short-circuit and an open-circuit between electrodes of the second capacitor in accordance with a voltage of one of a plurality of mode selection lines included in the display panel, wherein the mode selection circuit includes:

a first selection transistor having a control terminal connected to the one of the scanning lines, and a second selection transistor having a control terminal connected to the one of the mode selection lines, and the first selection transistor and the second selection transistor are connected in series with each other and provided in parallel with the second capacitor.

19. The pixel circuit according to claim 18, wherein the first capacitor includes one electrode and another electrode respectively connected to the control terminal and the conductive terminal of the drive transistor, the conductive terminal of the drive transistor being on the light-emitting element side.

* * * * *